United States Patent [19]
Manabe

[11] Patent Number: 5,592,091
[45] Date of Patent: Jan. 7, 1997

[54] METHOD FOR SHIMMING A MAGNETIC FIELD IN AN EXAMINATION SPACE OF A NUCLEAR MAGNETIC RESONANCE APPARATUS INCLUDING USE OF FUZZY LOGIC

[75] Inventor: Atsutaka Manabe, Roettenbach, Germany

[73] Assignee: Siemens Aktiengesellschaft, Munich, Germany

[21] Appl. No.: 313,386

[22] Filed: Sep. 27, 1994

[30] Foreign Application Priority Data

Sep. 30, 1993 [DE] Germany .................. 43 33 440.7

[51] Int. Cl.$^6$ ........................... G01V 3/00; G01R 33/20
[52] U.S. Cl. ................................ 324/320; 324/319
[58] Field of Search .................. 324/320, 319, 324/318, 322, 307, 309; 128/653.5

[56] References Cited

U.S. PATENT DOCUMENTS

| | | | |
|---|---|---|---|
| 4,523,166 | 6/1985 | Gross | 324/320 |
| 4,680,551 | 7/1987 | O'Donnell et al. | 324/320 |
| 4,987,371 | 1/1991 | Glover et al. | 324/320 |
| 5,168,232 | 12/1992 | Glover et al. | 324/320 |
| 5,345,178 | 9/1994 | Manabe et al. | 324/320 |
| 5,391,990 | 2/1995 | Schmitt et al. | 324/320 |
| 5,491,775 | 2/1996 | Madau et al. | 315/3 |
| 5,497,063 | 3/1996 | Day et al. | 318/610 |
| 5,499,319 | 3/1996 | Sultan et al. | 395/3 |
| 5,506,935 | 4/1996 | Shigeoka et al. | 395/3 |

OTHER PUBLICATIONS

Ronald Yager & Dimitar P. Filev, "Essentials of Fuzzy Modeling and Control" ©1994 John Wiley & Sons, Inc.
"The Ancient and Honourable Art of Shimming", Chmurny et al., Concepts in Magnetic Resonance, vol. 2, (1990), pp. 131–149.
"Aspects if Shimming a Superconductive Whole–Body MRI–Magnet," Fresc et al., Proceedings of the 9th Int. Conf. on Mag. Technol., Zurich, Sep. 9–13, (1985), pp. 249–251.
"Fast, Noniterative Shimming of Spatially Localized Signals. In Vivo Analysis of the Magnetic Field along Axes," Gruetter et al., J. Mag. Res., No. 96 (1992) pp. 323–334.
"Automatic, Localized in Vivo Adjustment of All First–and Second–Order Shim Coils," Gruetter, Mag. Res. in Med., No. 29, (1993), pp. 804–811.

Primary Examiner—Sandra L. O'Shea
Assistant Examiner—Roger Phillips
Attorney, Agent, or Firm— Hill, Steadman & Simpson

[57] ABSTRACT

Nuclear magnetic resonance signals are multiply excited and a plurality of data sets corresponding to the nuclear magnetic resonance signals are obtained and are used for calculating the coefficients of a spherical harmonic function that describes the magnetic field distribution in the examination space. Each data set acquired in this way has a weighting that correlates with the plausibility (reliability) of the data set allocated to it. Taking the respective weighting into consideration, coefficients of the spherical harmonic functions are acquired from the data sets acquired and are used to calculate respective currents that are supplied to the corresponding shim coils.

21 Claims, 13 Drawing Sheets

| Projection Axis | Phase Curve | Measured Value | Theoretical Value |
|---|---|---|---|
| x=y | $\phi = \beta_{21} \cdot r^2$ | $\beta_{21} \cdot r^2$ | $+\alpha r^2$ |
| x=-y | $\phi = \beta_{22} \cdot r^2$ | $\beta_{22} \cdot r^2$ | $-\alpha r^2$ |

FIG 14

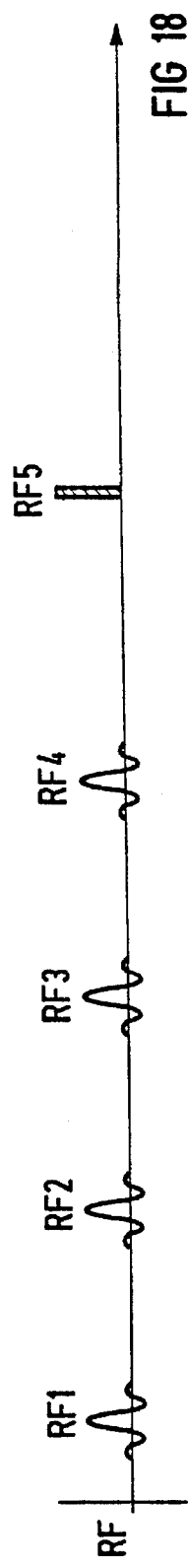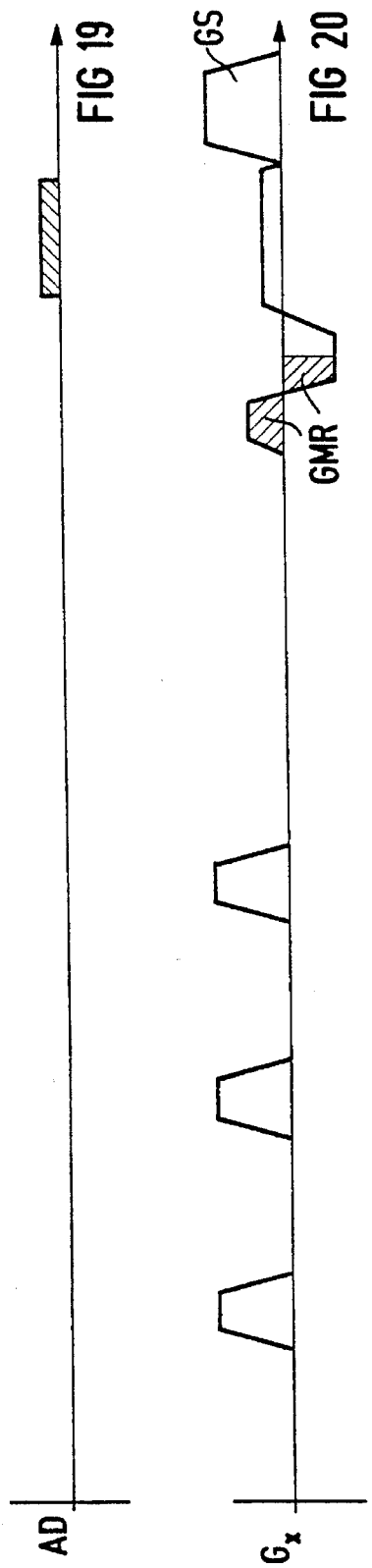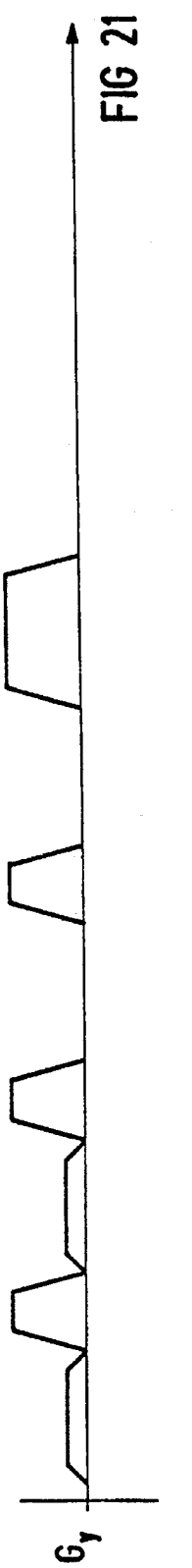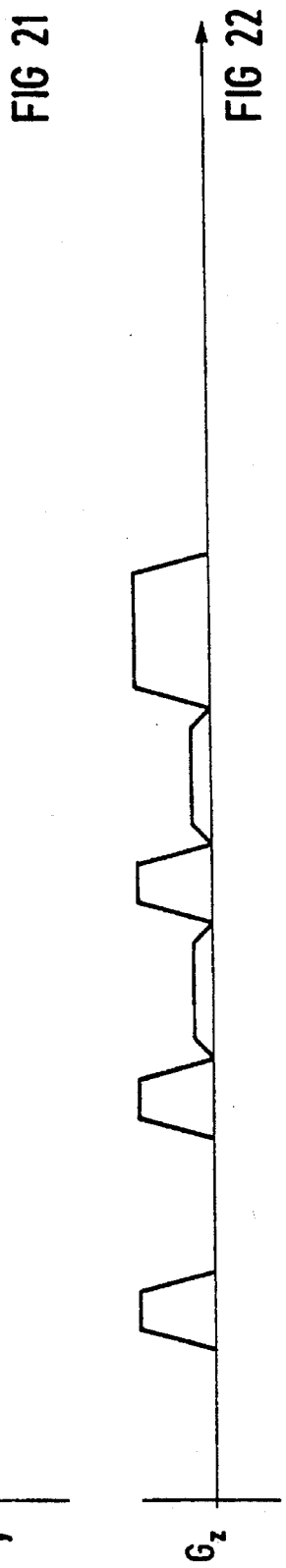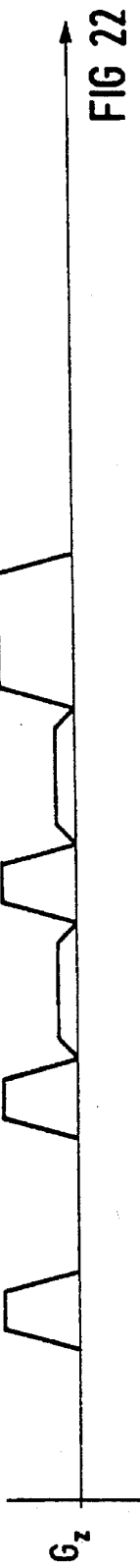

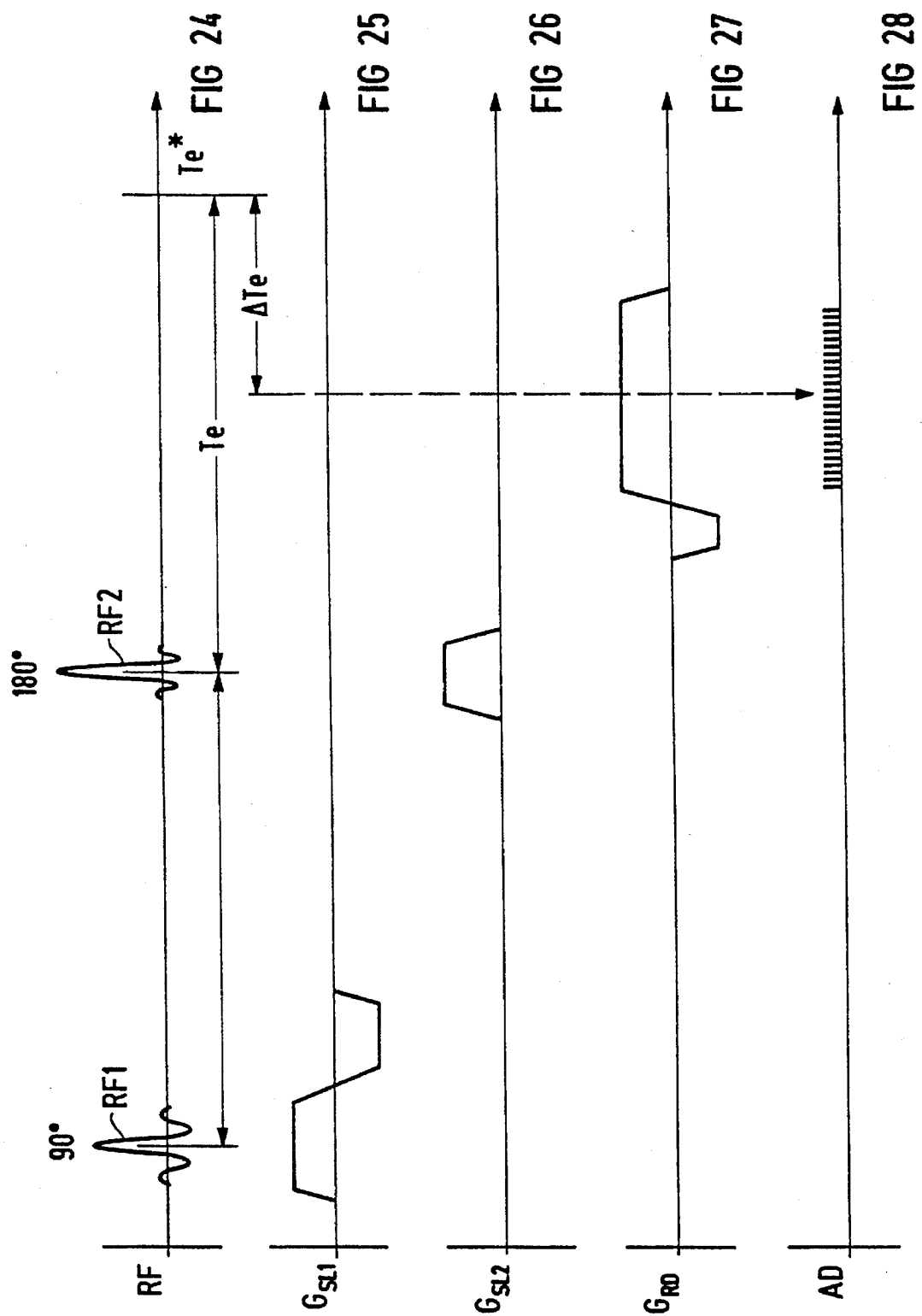

FIG 29

| | X-AXIS (Y=Z=0) | Y-AXIS (X=Z=0) | Z-AXIS (X=Y=0) | X=Y AXIS (Z=0) | X=-Y AXIS (Z=0) | X=Z AXIS (Y=0) | X=-Z AXIS (Y=0) | Y=Z AXIS (X=0) | Y=-Z AXIS (X=0) |
|---|---|---|---|---|---|---|---|---|---|
| A1.0 "Z" | 0 | 0 | $\alpha r$ | 0 | 0 | $\frac{\alpha}{\sqrt{2}} r$ | $-\frac{\alpha}{\sqrt{2}} r$ | $\frac{\alpha}{\sqrt{2}} r$ | $-\frac{\alpha}{\sqrt{2}} r$ |
| A2.0 "Z²" | $-\frac{\alpha}{2} r^2$ | $-\frac{\alpha}{2} r^2$ | $\alpha r^2$ | $-\frac{\alpha}{2} r^2$ | $-\frac{\alpha}{2} r^2$ | $\frac{\alpha}{4} r^2$ | $\frac{\alpha}{4} r^2$ | $\frac{\alpha}{4} r^2$ | $\frac{\alpha}{4} r^2$ |
| A3.0 "Z³" | 0 | 0 | $\alpha r^3$ | 0 | 0 | $\frac{\sqrt{2}\alpha}{8} r^3$ | $-\frac{\sqrt{2}\alpha}{8} r^3$ | $\frac{\sqrt{2}\alpha}{8} r^3$ | $-\frac{\sqrt{2}\alpha}{8} r^3$ |
| A4.0 "Z⁴" | $\frac{3\alpha}{8} r^4$ | $\frac{3\alpha}{8} r^4$ | $\alpha r^4$ | $\frac{3\alpha}{8} r^4$ | $\frac{3\alpha}{8} r^4$ | $-\frac{13\alpha}{32} r^4$ | $-\frac{13\alpha}{32} r^4$ | $-\frac{13\alpha}{32} r^4$ | $-\frac{13\alpha}{32} r^4$ |
| A1.1 "X" | $\alpha r$ | 0 | 0 | $\frac{\sqrt{2}\alpha}{2} r$ | $\frac{\sqrt{2}\alpha}{2} r$ | $\frac{\sqrt{2}\alpha}{2} r$ | $\frac{\sqrt{2}\alpha}{2} r$ | 0 | 0 |
| B1.1 "Y" | 0 | $\alpha r$ | 0 | $\frac{\sqrt{2}\alpha}{2} r$ | $-\frac{\sqrt{2}\alpha}{2} r$ | 0 | 0 | $\frac{\sqrt{2}\alpha}{2} r$ | $\frac{\sqrt{2}\alpha}{2} r$ |
| A2.1 "ZX" | 0 | 0 | 0 | 0 | 0 | $\alpha r^2$ | $-\alpha r^2$ | 0 | 0 |
| B2.1 "ZY" | 0 | 0 | 0 | 0 | 0 | 0 | 0 | $\alpha r^2$ | $-\alpha r^2$ |
| A2.2 "X²-Y²" | $\alpha r^2$ | $-\alpha r^2$ | 0 | 0 | 0 | $\frac{\alpha}{2} r^2$ | $\frac{\alpha}{2} r^2$ | $-\frac{\alpha}{2} r^2$ | $-\frac{\alpha}{2} r^2$ |
| B2.2 "XY" | 0 | 0 | 0 | $\frac{\sqrt{2}\alpha}{8} r^3$ | $-\frac{\sqrt{2}\alpha}{8} r^3$ | 0 | 0 | 0 | 0 |
| A3.1 "Z²X" | $-\frac{\alpha}{4} r^3$ | 0 | 0 | $\frac{\sqrt{2}\alpha}{8} r^3$ | $\frac{\sqrt{2}\alpha}{8} r^3$ | $\frac{\sqrt{2}\alpha}{16} r^3$ | $\frac{\sqrt{2}\alpha}{16} r^3$ | 0 | 0 |
| B3.1 "Z²Y" | 0 | $-\frac{\alpha}{4} r^3$ | 0 | $\frac{\sqrt{2}\alpha}{8} r^3$ | $-\frac{\sqrt{2}\alpha}{8} r^3$ | 0 | 0 | $\frac{3\sqrt{2}\alpha}{16} r^3$ | $\frac{3\sqrt{2}\alpha}{16} r^3$ |

5,592,091

METHOD FOR SHIMMING A MAGNETIC FIELD IN AN EXAMINATION SPACE OF A NUCLEAR MAGNETIC RESONANCE APPARATUS INCLUDING USE OF FUZZY LOGIC

BACKGROUND OF THE INVENTION

1. Field of the Invention

The invention is directed to a method for setting the current through shim coils and gradient coils in nuclear magnetic resonance apparatus.

2. Description of the Prior Art and Related Application

The homogeneity of the basic magnetic field is a critical factor for the imaging quality in nuclear magnetic resonance imaging apparatus. Field inhomogeneities in the imaging cause geometrical imaging distortions in the image area that are proportional to the field deviations. The field homogeneity is particularly important in the echo-planar method.

Extremely high demands are also made on the field homogeneity in nuclear magnetic resonance devices used for spectroscopy in order to achieve an adequate resolution of the spectral lines. Field inhomogeneities lead to overlapping of spectral lines.

As described in the article "Aspects of Shimming a Superconductive Whole Body MRI Magnet," G. Frese et al, Proceedings of the 9th Int. Conf. on Mag. Techn. Zurich, Sep. 9–13, 1985, pp. 249–251, a magnetic field can be represented with the expansion coefficients of spherical, harmonic functions. It is likewise known from this article that field deviations can be compensated by electrical shim coils. Linear field deviations, i.e., field errors of the first order, can also be compensated by charging gradient coils with an offset current, i.e., a constant current that is superimposed on a gradient pulse sequence.

Given higher demands on the field homogeneity, not only linear field deviations, but also field errors of higher orders must be compensated. For this purpose, specific shim coils that are to be charged with a suitable current are provided in addition to the gradient coils. In the imaging, the shimming, i.e., the setting of the currents via the individual shim coils as well as, if necessary, the setting of the offset current of gradient coils, is advantageously implemented before the examination of every individual patient, and typically before every measurement in spectroscopy.

The setting of the currents for the shim coils and of the offset currents for the gradient coils in order to achieve an optimum field homogeneity represents a complex problem that has hitherto often been iteratively solved. Iterative methods, however, are comparatively time-consuming, so that the dwell time of patients in the nuclear magnetic resonance tomography apparatus is lengthened. This is disadvantageous both in view of the psychological stress on the patient (particularly those given a tendency to claustrophobia) as well as in view of the possible patient throughput.

A non-iterative method for general shimming of magnets is described in the article, "Fast, Non-Iterative Shimming of Spatially Localized Signals," in Journal of Magnetic Resonance, pp. 323–334 (1992). The phase of nuclear spins is thereby identified in the direction of a plurality of projections with stimulated echo sequences. The magnetic field course in these projections can be measured on the basis of the phase curve. Thus, the coefficients of the phase curve can be identified given presentation of the magnetic field in spherical, harmonic functions. Every shim coil is allocated to a spherical, harmonic function of the $n^{th}$ degree and $m^{th}$ order. The coefficients calculated according to the above-described method are then employed as a measure for the currents to be supplied to the shim coils.

U.S. Pat. No. 5,345,178 ("Method for Setting the Current Through Shim Coils and Gradient Coils in a Nuclear Magnetic Resonance Apparatus", assigned to the same assignee (Siemens A G) as the present subject matter, Manabe et al.) discloses a method for shimming wherein a nuclear magnetic resonance signal is first acquired with a gradient or a spin echo sequence. Coefficients of the function describing the field distribution are then calculated by analyzing the nuclear magnetic resonance signal.

SUMMARY OF THE INVENTION

It is an object of the present invention to implement a method for shimming a magnetic field wherein the precision and the stability of the shimming are improved over known techniques.

The above object is achieved in a method for shimming a magnetic field, particularly a magnetic field in an examination space of a nuclear magnetic resonance apparatus, in accordance with the principles of the present invention wherein the magnetic field is mathematically representable in the form of spherical harmonic functions, and wherein shim coils are provided in an arrangement so that the shim coils cause a field distribution to arise in the examination space which corresponds to a specific coefficient of the spherical harmonic functions, the method including the steps of exciting nuclear magnetic resonance signals in the examination space and obtaining a data set, by evaluating the nuclear magnetic resonance signals, which identifies the coefficients of the aforementioned spherical harmonic functions, repeating the above step a number of times for each data set, each resulting data set acquired in this manner having a weighting which corresponds to the plausibility of the data associated therewith, and this weighting is taken into consideration in acquiring a coefficient of the spherical harmonic function. The current supplied to the allocated shim coil is then set dependent on this coefficient.

DESCRIPTION OF THE DRAWINGS

FIG. 14 shows the influence of a coefficient of the spherical harmonic function on two different projections.

FIGS. 18 through 22 show a pulse sequence which can be used in combination with the pulse sequences of FIGS. 17a through 17f, in accordance with the principles of the present invention, to analyze only a volume block of selected size within the total examination volume.

FIGS. 24 through 28 show a pulse sequence which can be used in combination with the pulse sequences of FIGS. 17a through 17f, in accordance with the principles of the present invention, for examining a selected slice within the examination volume.

FIG. 29 is a table showing the twelve spherical coefficients related to the identified coordinate axes, obtained in accordance with the method of the invention.

DESCRIPTION OF THE PREFERRED EMBODIMENTS

As is known, a spatial resolution of the nuclear magnetic resonance signals in nuclear magnetic resonance tomography ensues by superimposing a linear magnetic field gradient on a homogenous, static basic field on the order of magnitude of 1 tesla. The basic principles of such imaging are explained, for example, in the article by Bottomley, "NMR-Imaging Techniques and Application: A Review," in Review of Scientific Instrum., 53 (9), 9/82, pp. 1319–1337.

Figure 1:
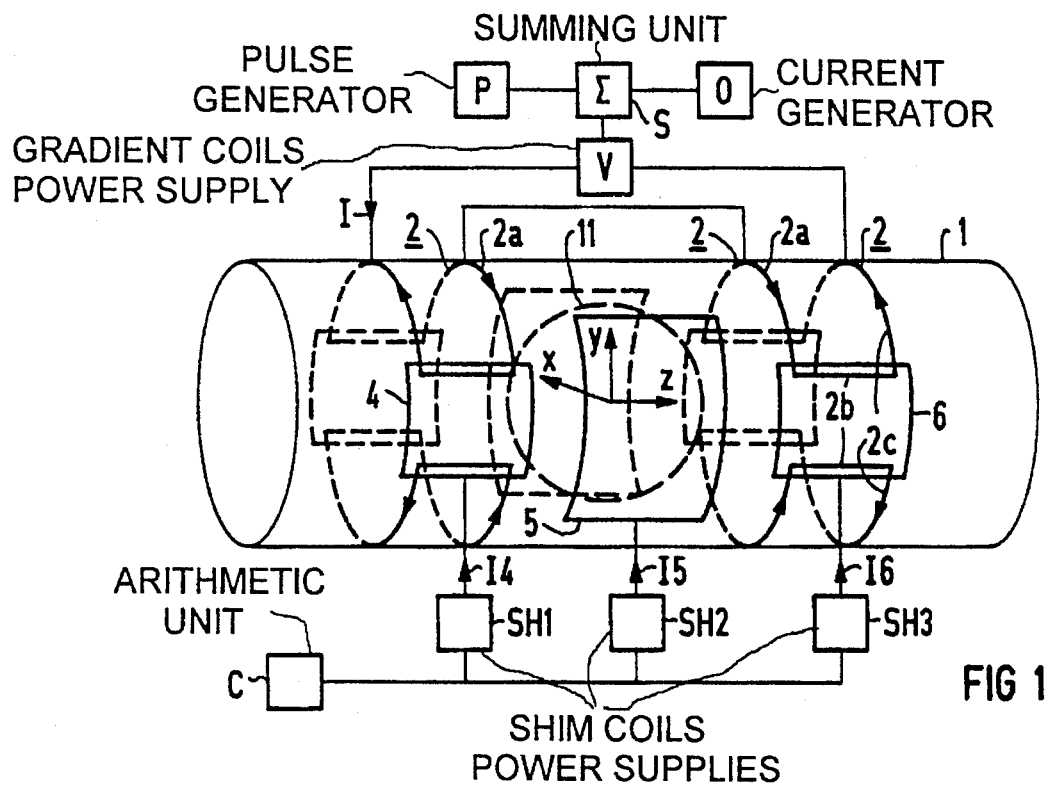
FIG. 1 is a schematic diagram showing an exemplary embodiment of an x-gradient coil (or a y-gradient coil) as well as saddle-shaped shim coils in a conventional (known) arrangement in a nuclear magnetic resonance apparatus, the apparatus being operable in accordance with the principles of the present invention.

For spatial resolution in three dimensions, magnetic field gradients must be generated in three directions that preferably reside perpendicularly relative to one another. A set of Cartesian coordinate axes (x, y, z) that is intended to represent the direction of the respective gradients is shown in each of FIGS. 1 and 2. FIG. 1 schematically shows a conventional arrangement of gradient coils for generating a magnetic field gradient $G_y$ in the y-direction. The gradient coils 2 are executed as saddle coils that are secured on a carrying tube 1. A substantially constant magnetic field gradient $G_y$ in the y-direction is generated within a spherical examination volume 11 by the conductor section 2a. Due to their greater distance from the examination volume 11, the return conductors generate only negligible components therein.

The gradient coils for the x-magnetic field gradients are identical to the gradient coils 2 for the y-magnetic field gradients and are merely turned by 90° in the azimuthal direction on the carrying tube 1. For clarity, they are therefore not shown in FIG. 1.

Shim coils 4 through 6 that are likewise executed as saddle coils are also shown in FIG. 1. The shim coils 4 through 6 are merely schematically indicated; details about the design of shim coils may be found, for example, in U.S. Pat. No. 3,569,823. Every shim coil 4 through 6 has a respective power supply SH1 through SH3 allocated to it, these supplying the respective shim coils 4 through 6 with currents 14 through 16. The currents 14 through 16 can be controlled via an arithmetic unit C.

Figure 2:
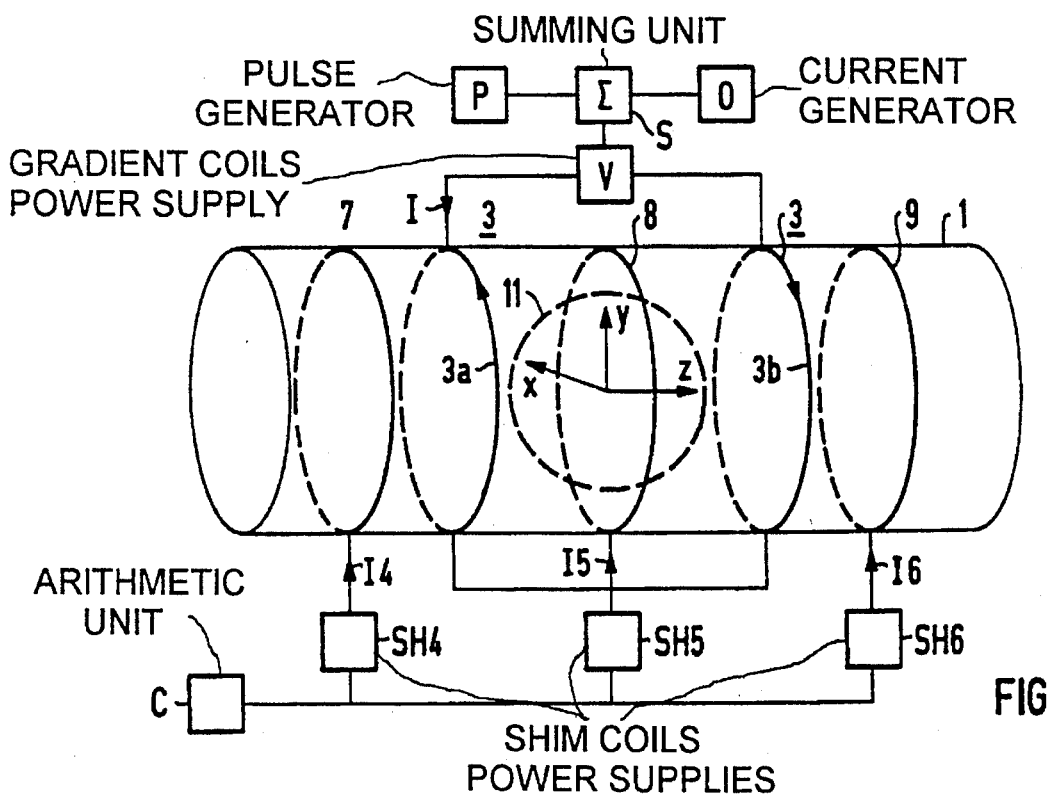
FIG. 2 is a schematic diagram showing an exemplary embodiment of a z-gradient coil, as well as further shim coils, for use in a nuclear magnetic resonance apparatus in combination with the coil arrangement of FIG. 1.

The gradient coils 3 for the magnetic field gradients in the z-direction are schematically shown in FIG. 2. The coils are annularly executed and are symmetrically arranged relative to the mid-point of the examination volume 11. Since the two individual coils 3a and 3b are permeated by current in opposite directions as shown in FIG. 2, they generate a magnetic field gradient in the z-direction. Further shim coils 7 through 9, which are annular in this case and which are likewise charged with currents 14 through 16 via current supplies SH4 through SH6, are also shown in FIG. 2, again only schematically. The currents 14 through 16 can again be controlled by the arithmetic unit C.

The power supply V for the gradient coils 2 and 3 is also schematically shown in FIGS. 1 and 2. The current I through the respective gradient coil 2 or 3 is defined by a pulse generator P, prescribing a measurement sequence and by a generator O for a current. The output signals of the pulse generator P and of the generator O are added in a summing unit S.

As set forth in the aforementioned article by Frese et al., "Aspects of Shimming a Superconductive Whole Body MRI Magnet," magnetic fields can be represented on the basis of spherical, harmonic functions. The solution for the axial component Bz of the magnetic field is:

$$Bz(\vec{r}) = \sum_{n=0}^{\infty} (r/R)^n \sum_{m=0}^{\infty} P(n,m)(\cos\theta) [A(n,m)\cos(m\phi) + B(n,m)\sin(m\phi)],$$

wherein R, $\Theta$ and $\psi$ are the spherical coordinates of the vector $\vec{r}$, R is the radius of the volume to be imaged, P(n,m) are the corresponding Legendre polynomials of the degree n and of the order m, and A(n,m) and B(n,m) are the coefficients of the spherical, harmonic functions. The coefficient A(0,0) characterizes the homogenous basic field; all other coefficients describe homogeneity deviations. As set forth in U.S. Pat. No. 3,569,823, cited above, shim coils can be fashioned such that they essentially influence one of these coefficients, i.e., compensate the field disturbance corresponding to these coefficients.

In practice, of course, only a limited number of shim coils can be provided, so that only a corresponding number of the said coefficients of the spherical, harmonic functions can be set to zero. In nuclear magnetic resonance tomography and in spectroscopy, one generally manages with 9 non-linear shim coils even given high demands, so that—together with the three gradient coils,—12 spherical coefficients that have the greatest disturbing effect on the field distribution can be brought to zero.

It is first necessary for shimming to identify the existing field course. The existing field distribution can be identified, for example, using the method disclosed in the aforementioned copending U.S. Pat. No. 5,345,178. For explaining this method, details thereof shall be set forth below with reference to FIGS. 3 through 10.

Figure 3:
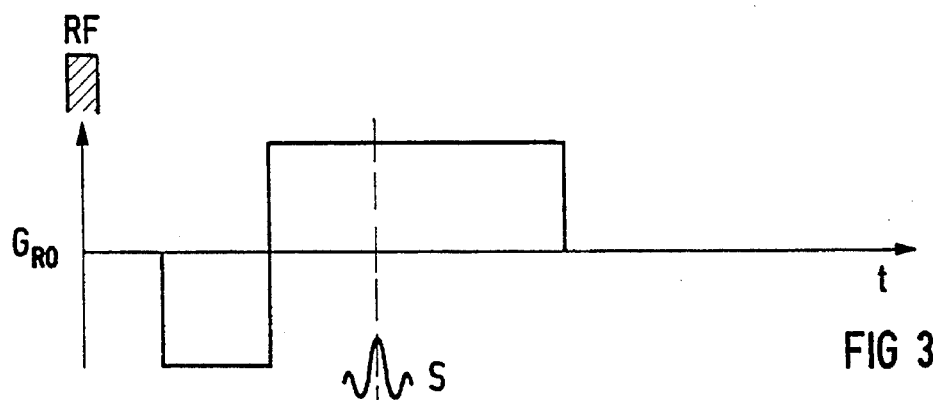
FIG. 3 shows a conventional gradient echo sequence in ideal form.

FIG. 3 schematically shows a conventional gradient echo sequence wherein, following a radio-frequency excitation pulse RF, the excited spins are first dephased by a gradient $G_{RO}$ and are then in turn rephased by reversing the polarity of the gradient $G_{RO}$. A gradient echo signal S appears at time $t_0$ in a magnetic field that is completely homogenous apart from the gradient $G_{RO}$, wherein the time $t_0$ is defined as the time required for the time integral to become zero over the entire, effective gradient $G_{RO}$:

$$\int_0^{t_0} G_{RO}(t)dt = 0$$

Figure 4:
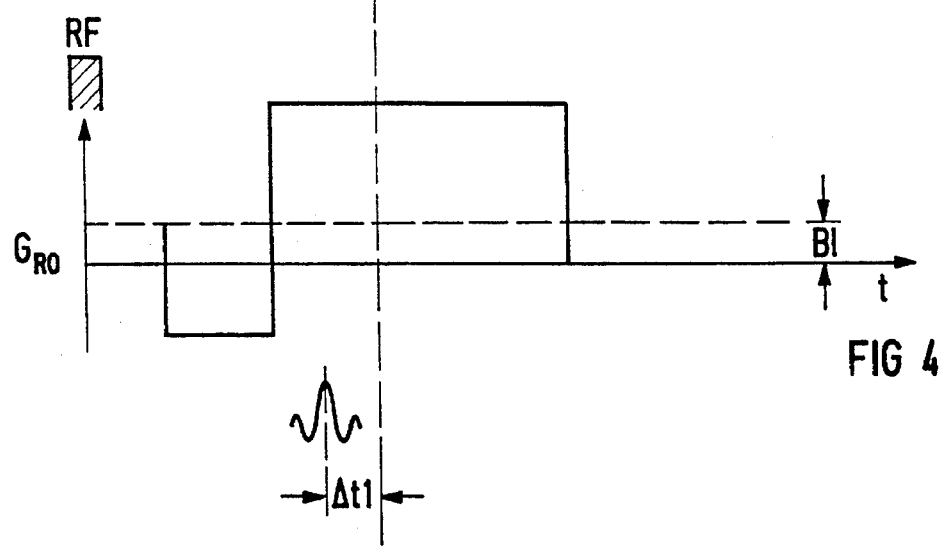
FIG. 4 shows a conventional gradient echo sequence in the presence of a positive, linear inhomogeneity in the basic magnetic field.

FIG. 4 shows the same pulse sequence, whereby a field inhomogeneity BI—assumed to be linear in this case—in the direction of the gradient $G_{RO}$ is superimposed upon the basic magnetic field. This linear field inhomogeneity BI in the direction of the gradient $G_{RO}$ can be added to the latter and leads to the fact that the echo condition is now reached earlier, i.e., the signal S precedes the normal echo time $t_0$ by the time span $\Delta t1$.

Figure 5:
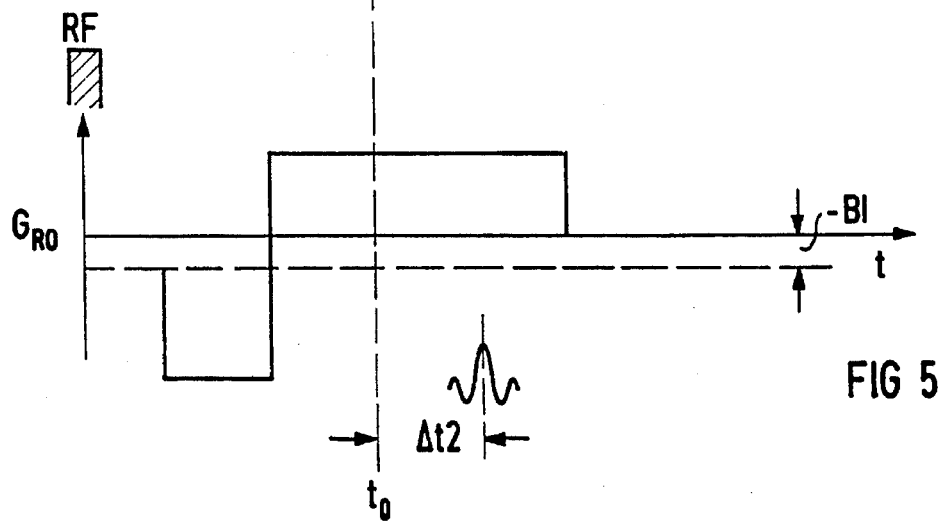
FIG. 5 shows a conventional gradient echo sequence in the presence of a negative, linear inhomogeneity in the basic magnetic field.

FIG. 5 shows the gradient echo sequence of FIG. 3, whereby a negative, linear field deviation is present in the direction of the gradient $G_{RO}$. This leads to the fact that the echo time now lies following the normal echo time $t_0$ by the time span $\Delta t2$.

The time shift $\Delta t$ thus represents the measure for linear field deviations in the direction of the gradient $G_{RO}$.

Figure 6:
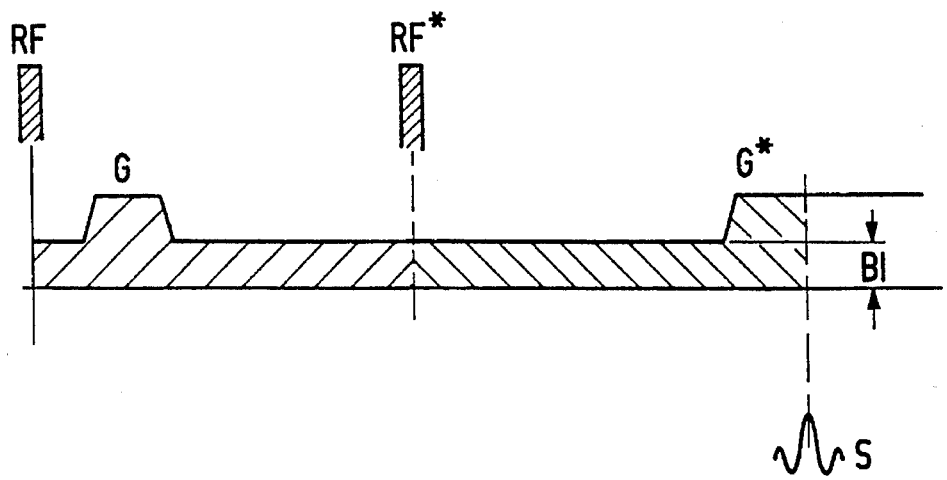
FIG. 6 shows a conventional spin echo sequence in ideal form.

Information about field inhomogeneity can be obtained not only with gradient echoes, but also with spin echoes in an alternative embodiment according to FIGS. 6 though 8. For explanation, a conventional spin echo sequence is first shown in FIG. 6. A radio-frequency pulse RF is thereby first followed by a gradient G, then by a 180° radio-frequency pulse RF*, and finally by a gradient G* under which a spin echo S is read out. A linear field inhomogeneity B1, i.e., a field inhomogeneity of the first order, is effective in the direction of the gradient G during the entire time. This corresponds to an additional gradient in the direction of the gradient G.

In the normal case, the 180° radio-frequency pulse RF* is centrally arranged between the radio-frequency pulse RF and the spin echo signal S. This leads to the fact that a constant field inhomogeneity BI does not influence the position of the spin echo signal S, since the gradient areas to the left and right of the 180° radio-frequency pulse RF* are the same.

Figure 7:
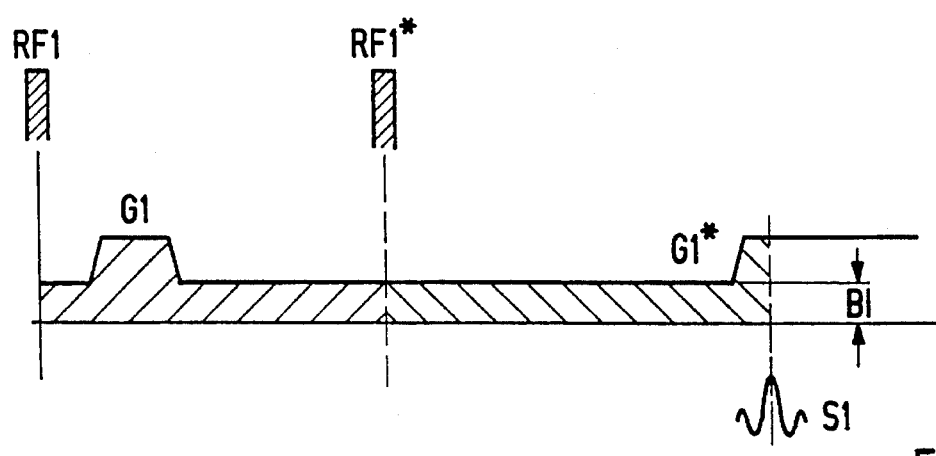
FIG. 7 shows a conventional spin echo sequence in the presence of a positive, linear inhomogeneity in the basic magnetic field.

In order to calculate the field inhomogeneity BI, the 180° radio-frequency pulse RF1* is shifted toward the left compared to the central position in a first sequence according to FIG. 7. Without field inhomogeneity, this would have no influence on the position of the spin echo S1, since only the gradient areas of the gradients G1 and G1* would be determinative for the echo condition. The linear field inhomogeneity BI, however, leads to the echo signal S1 being shifted toward the left (i.e., appears earlier). This becomes apparent on the basis of a comparison of the entire gradient area between first radio-frequency pulse RF1 and 180° radio-frequency pulse RF1 * and the gradient area between 180° radio-frequency pulse RF1 * and the echo signal S1.

In a second sequence having a second radio-frequency pulse RF2 and a second gradient pulse G2, the 180° radio-frequency pulse RF2* is shifted toward the right compared to the central position. The effect of the field inhomogeneity BI on the resulting spin echo signal S2 is a shift toward the right, this again becoming apparent on the basis of a comparison of the effective gradient areas.

Figure 8:
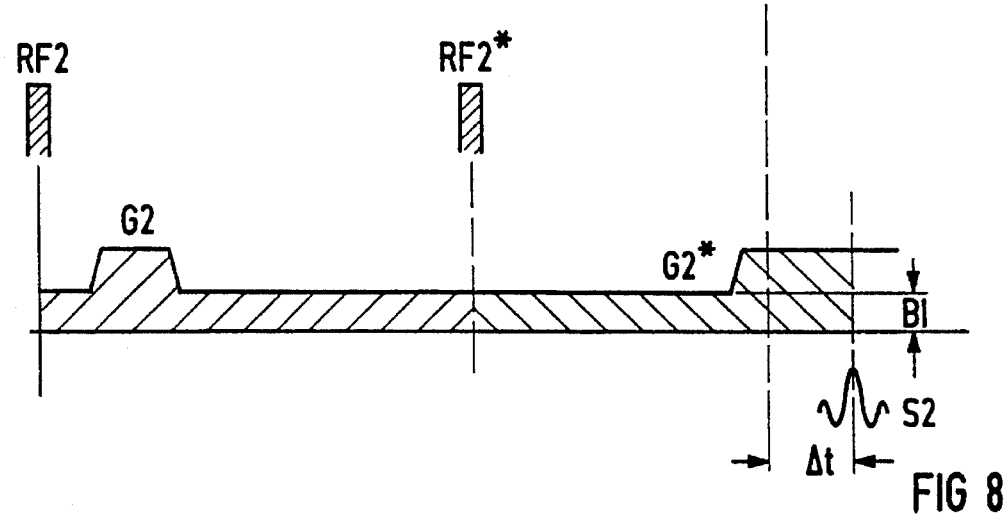
FIG. 8 shows a conventional spin echo sequence in the presence of a negative, linear inhomogeneity in the basic magnetic field.

By comparing the echo position in the two sequences of FIG. 7 and 8, one can thus likewise calculate a time difference a, t that in turn represents a measure for the linear field inhomogeneity BI.

On the basis of a shift of echo times, thus, one could measure linear field inhomogeneities in a specific direction by gradient echo sequences or spin echo sequences having a gradient in this direction. The direct measurement of the time differences, however, has the disadvantage that only linear magnetic field deviations can be recognized thereby and the required identification of the echo centers is not entirely simple. Field inhomogeneities of a general type, however, can be calculated from the analysis of the phase curves acquired after Fourier transformation of the echo signals, as set forth below.

Figure 9:
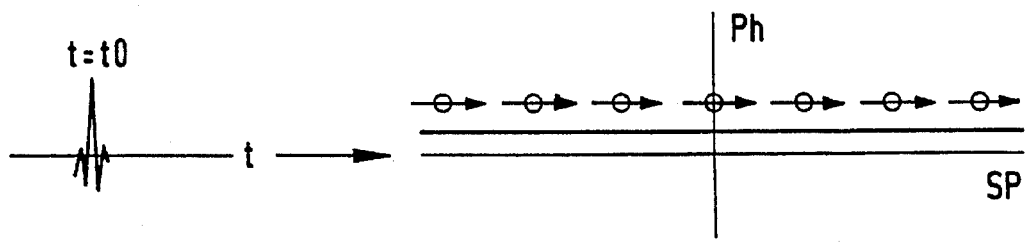
FIG. 9 is a schematic representation showing the phase relation to the spin position of a Fourier-transformed nuclear magnetic resonance signal, under ideal conditions.

Given a completely homogeneous magnetic field, all spins of a gradient echo have the same phase relation. When, thus, the echo signal is Fourier-transformed and evaluated with respect to phase, one obtains a constant value of the phase relation over the spin position. The echo position and the phase curve for the case of a completely homogenous field are shown in FIG. 9: the gradient echo appears exactly at the normal echo position $t_0$; the phase Ph schematically entered over the spin position SP has a constant value independently of the spin position SP.

Figure 10:
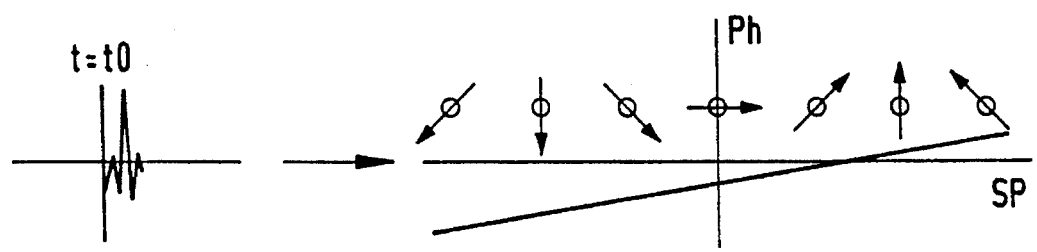
FIG. 10 is a schematic representation showing the phase curve in the presence of a negative, linear inhomogeneity in the basic magnetic field.
Figure 11:
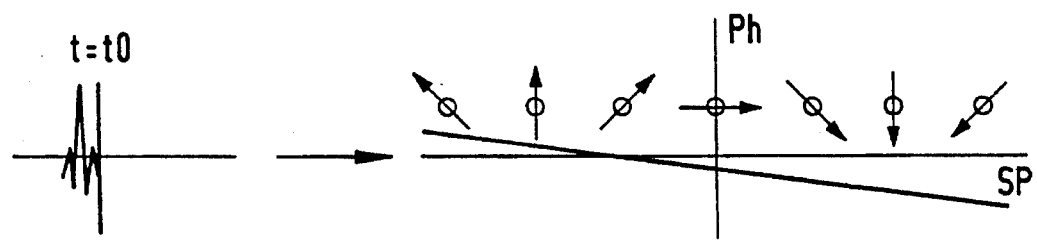
FIG. 11 is a schematic representation showing the phase curve in the presence of a positive, linear inhomogeneity in the basic magnetic field.

Corresponding to FIG. 5, FIG. 10 shows a negative linear field deviation, namely a field deviation of the first order in the direction of the gradient $G_{RO}$. In this case, the echo time is shifted toward the right, and the phase curve exhibits a slope that exactly corresponds to the echo time shift and represents the information about the field inhomogeneity of the first order in the direction of the gradient $G_{RO}$. The analogous case is shown in FIG. 11 for a positive linear field deviation (i.e., again for field inhomogeneity of the first order).

Figure 12:
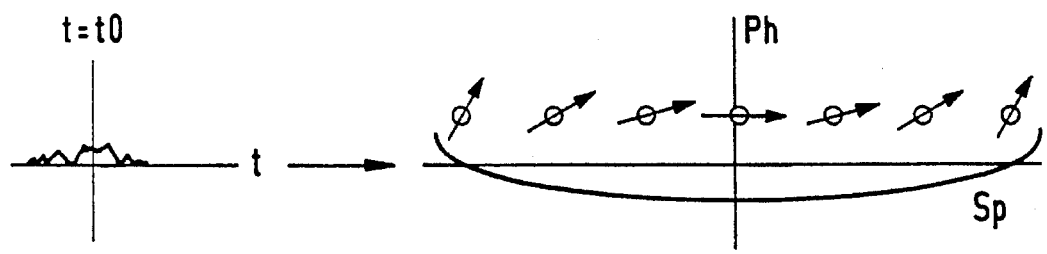
FIG. 12 is a schematic representation of the please curve in the presence of a basic magnetic field exhibiting inhomogeneities of the second order (i.e., non-linear).

Not only field deviations of the first order, but also field deviations of a higher order can be acquired with the assistance of the Fourier transformation. At the left, FIG. 12 shows a signal in the time domain, whereby the magnetic field does not exhibit any field inhomogeneity of the first order, but exhibits field inhomogeneities of the second order. Therefore, although the echo time is not shifted, the echo is spread. The allocated phase curve having the schematically illustrated phase relations of individual spins characterizes field inhomogeneities of the second order.

Figure 13:
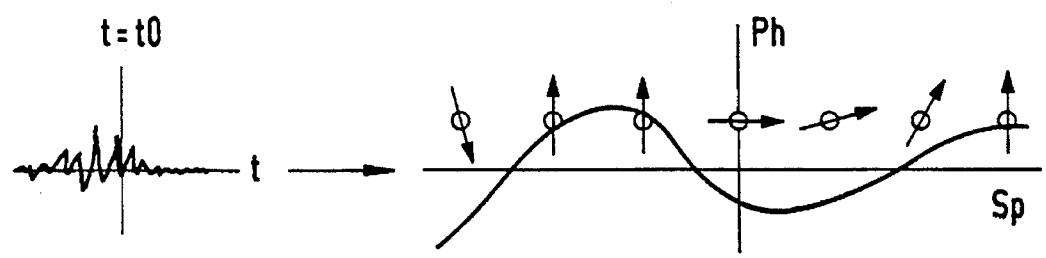
FIG. 13 is schematic representation of the phase curve in the presence of a basic magnetic field having field inhomogeneities higher than the second order.

FIG. 13 is directed to field inhomogeneities of a higher order, wherein the time signal is no longer directly indicative at all with respect to the field inhomogeneity. The phase curve, however, also clearly represents the field inhomogeneity of the higher order.

Stated generally, thus, the field course in the direction of the applied gradient can be identified by generating a gradient echo or a spin echo, by Fourier transformation of the nuclear magnetic resonance signal thus obtained and evaluation of the phase information thus obtained. Field inhomogeneities of the $n^{th}$ order are expressed in a phase curve of the same order. In order to obtain adequate information about field inhomogeneities, such a method must be implemented for a plurality of gradient directions, referred to below as projections. The number of necessary projections depends on how many of the terms describing the field inhomogeneity are to be compensated in the representation of the magnetic field with spherical, harmonic functions. Each coefficient of the spherical, harmonic function to be eliminated must thus be identified by projections. In order to keep the plurality of required projections low, the projection axes are selected such that the effect on the individual coefficients can be separated as simply as possible. The table in FIG. 29 shows the twelve spherical coefficients $A(n,m)$ and $B(n,m)$ that usually contribute the greatest amount to field inhomogeneities. These coefficients refer to a representation of the basic magnetic field according to the equation for $Bz(\vec{r})$ set forth above. The abbreviation for these components is also shown in the same column in Cartesian notation.

It has proven beneficial for calculating the coefficients according to Table 1 to identify the field course in the following projections: x-axis, y-axis, z-axis, axis x=y, axis x=−y, axis x=z, axis x=−z, axis y=z and axis y=−z. The table shows how field inhomogeneities that are described by the spherical coefficients $A(n,m)$, $B(n,m)$ influence these projections. The distance from the origin is thereby referenced r and $\alpha$ represents a coefficient. For example, one can recognize the following relationships:

Field inhomogeneities characterized by the coefficient A2.0 influence all projections.

Field inhomogeneities characterized by the coefficient A2.2 influence the x, y, x=z, x=−z, y=z, y=−z projections.

Field inhomogeneities characterized by the coefficient B2.2 appear in the projections x=y and x=−y, i.e., on axes that have an angle of 45° or 135° within the x/y plane.

All twelve spherical coefficients can be calculated on the basis of this table.

In practice, the phase curve obtained with the Fourier transformation is evaluated by smoothing and implementing a fit method using the smoothed curve, following the Fourier transformation. Polynomial coefficients are thereby attained that are placed in relationship to the polynomial coefficients of the equation for $Bz(\vec{r})$ cited above. All polynomial coefficients from the table can thus be calculated step-by-step to obtain the spherical coefficients.

The precision of the method can be improved by implementing not only one measurement per projection, but by averaging a plurality of measurements per projection. Since the influence of each spherical coefficient appears in a plurality of projection axes, the measuring precision can also be enhanced, for example, by averaging measured values in the various projection axes. As may be seen from the table in FIG. 29, the spherical coefficient B2.2 influences the "x=y" axis as well as the "x=−y" axis. A simple averaging of the measured values could therefore be implemented.

In practice, however, the plausibility, reliability or accuracy, of the phase curves differs substantially. This can have a number of different causes such as, for example, directionally dependent inhomogeneities of the basic magnetic field, motion artifacts (for example, due to heartbeats or patient movements), low signal-to-noise ratio, and external disturbances.

According to the present invention, the precision in the calculation of the coefficients of the spherical harmonic functions describing the field distribution can be substantially improved by, instead of implementing a simple averaging, allocating a fuzzy parameter to every measured value. In the present example, such fuzzy parameters can be allocated as weighting the factors for the respective polynomial coefficients of the phase curves. The concepts of fuzzy logic employed herein are described in more detail, for example, in the text "Essentials Of Fuzzy Modeling And Control," Yaeger et al., John Wiley & Sons Inc. (1994).

The weighting factor is defined such that it has a higher value (magnitude) as the plausibility of the underlying measured value increases (in this case, thus, the plausibility of the measured nuclear magnetic resonance signal). Plausible (reliable) data provide a large contribution to the final result; data recognized as less plausible (unreliable) are nearly left out of consideration in the calculation of the final result. For example, the correlation factor between the calculated FIT function and the calculated phase curve can be selected as the fuzzy parameter, or weighting factor. When the correlation factor lies in the proximity of one, it can be assumed that the underlying measured value is reliable. The respective fuzzy parameter of every polynomial coefficient acquired from the associated FIT function is then calculated as a function of the correlation factor.

The amplitude of the nuclear magnetic resonance signal in the time domain can also be employed as a further fuzzy parameter. This amplitude corresponds to the amplitude integral of the Fourier transformed signal, so that this integral can be alternatively employed. It is probable that nuclear magnetic resonance signals having high amplitude are less noisy and thus the data acquired therefrom are more precise than given low-amplitude nuclear magnetic resonance signals.

The method for the coefficient B2.2 of the spherical harmonic function shall be set forth below with reference to FIGS. 14 and 15.

As shown in FIG. 14 and as may likewise be derived from the table of FIG. 29, the coefficient B2.2 influences the "x=y" axis and the "x=−y" axis. The theoretical influence in the "x=y" axis is established by $+\alpha \cdot r^2$ and that in the "x=−y" axis is established by $-\alpha \cdot 2$. The spacing from the origin of the spherical coordinate system is thereby referenced r, and $\alpha$ represents a coefficient. On the basis of the FIT curve obtained in FIG. 14 by Fourier transformation of a nuclear magnetic resonance signal and a subsequent FIT operation, $\beta_{21}r^2$ and $\beta_{22}r^2$ are obtained as measured values. Given simple averaging, the coefficient $\alpha$ would be calculated in the following way from these coefficients $\beta_{21}$ and $\beta_{22}$ acquired by measurement:

$$\alpha = \frac{1}{2} \beta_{21} - \frac{1}{2} \beta_{22}$$

According to the fuzzy logic, however, the coefficient $\alpha$ is calculated in the following way:

$$\alpha = (C_1 \beta_{21} - C_2 \beta_{22}) / \sum_{i=1}^{2} C_i$$

wherein $C_1$ and $C_2$ represent the fuzzy parameters allocated to the respective FIT functions.

Figure 15:
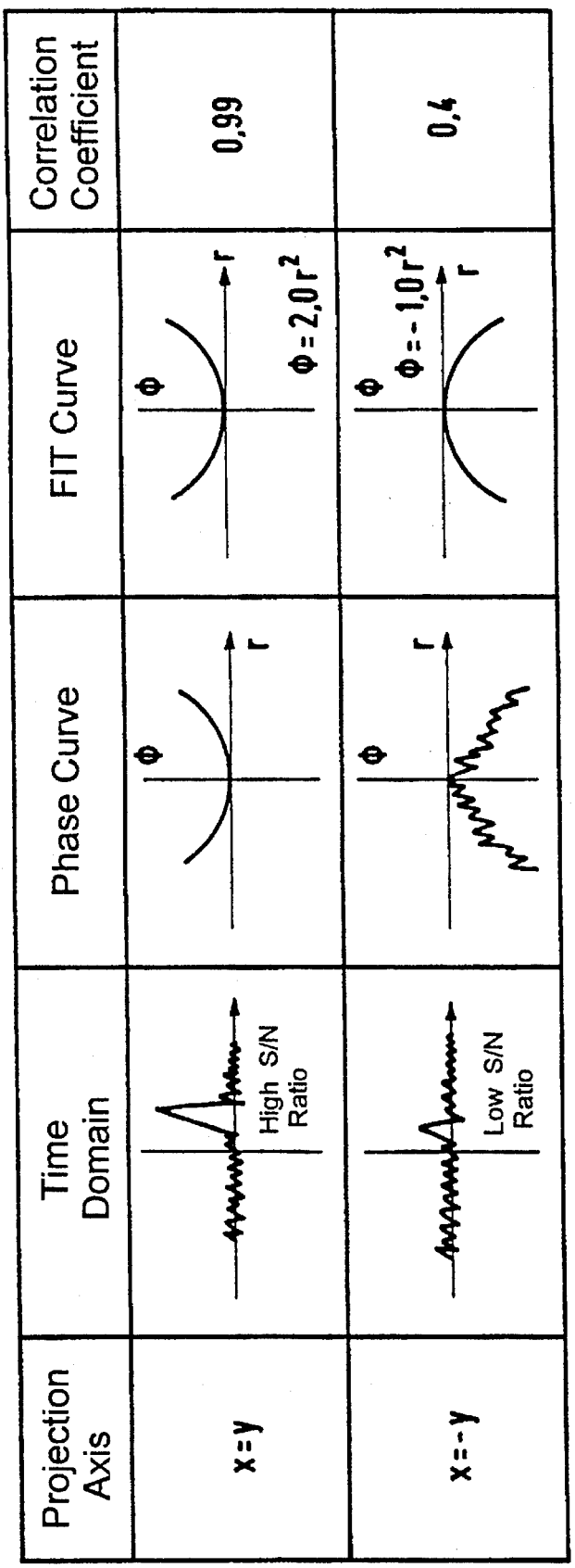
FIG. 15 shows the relationship between the nuclear magnetic resonance signal, the phase curve and the FIT curve for the two projections of FIG. 14.

Simple averaging and calculation of a value according to the rules of fuzzy logic are compared to one another as shown in the example of FIG. 15, namely for the "x=y" axis and the "x=−y" axis once again. It is assumed that a high signal-to-noise ratio is present in the signal acquisition for the "x=y" axis but a low signal-to-noise ratio is present in the measurement of the "x=−y" axis. The phase curve calculated by Fourier transformation of the acquired signals then exhibits a relatively smooth course for the "x=y" axis but exhibits an extremely irregular course for the "x=−y" axis. The FIT function of the second order then yields a relatively exact phase course. When it is assumed that the exact value is α=2, a function Φ=2r² would be obtained in the FIT function for the "x=y" axis given exact measurement. However, an imprecise value, Φ=−1r² instead of Φ=−2r² in the recited example is obtained for the "x=−y" axis.

The following value for α would be obtained with simple averaging:

$$\alpha = \frac{2.0 + 1.0}{2} = 1.5$$

When, however, a fuzzy factor is defined in the following way:

$$C = v^2,$$

whereby v is the correlation coefficient between phase curve and FIT function, then the following value α is obtained:

$$\alpha = \frac{0.99^2 \cdot 2.0 = 0.4^2 \cdot (-1.0)}{0.99^2 + 0.4^2} = 1.86$$

The value acquired according to the fuzzy logic thus comes clearly closer to the true value α=2 than that acquired by averaging.

Figure 16:
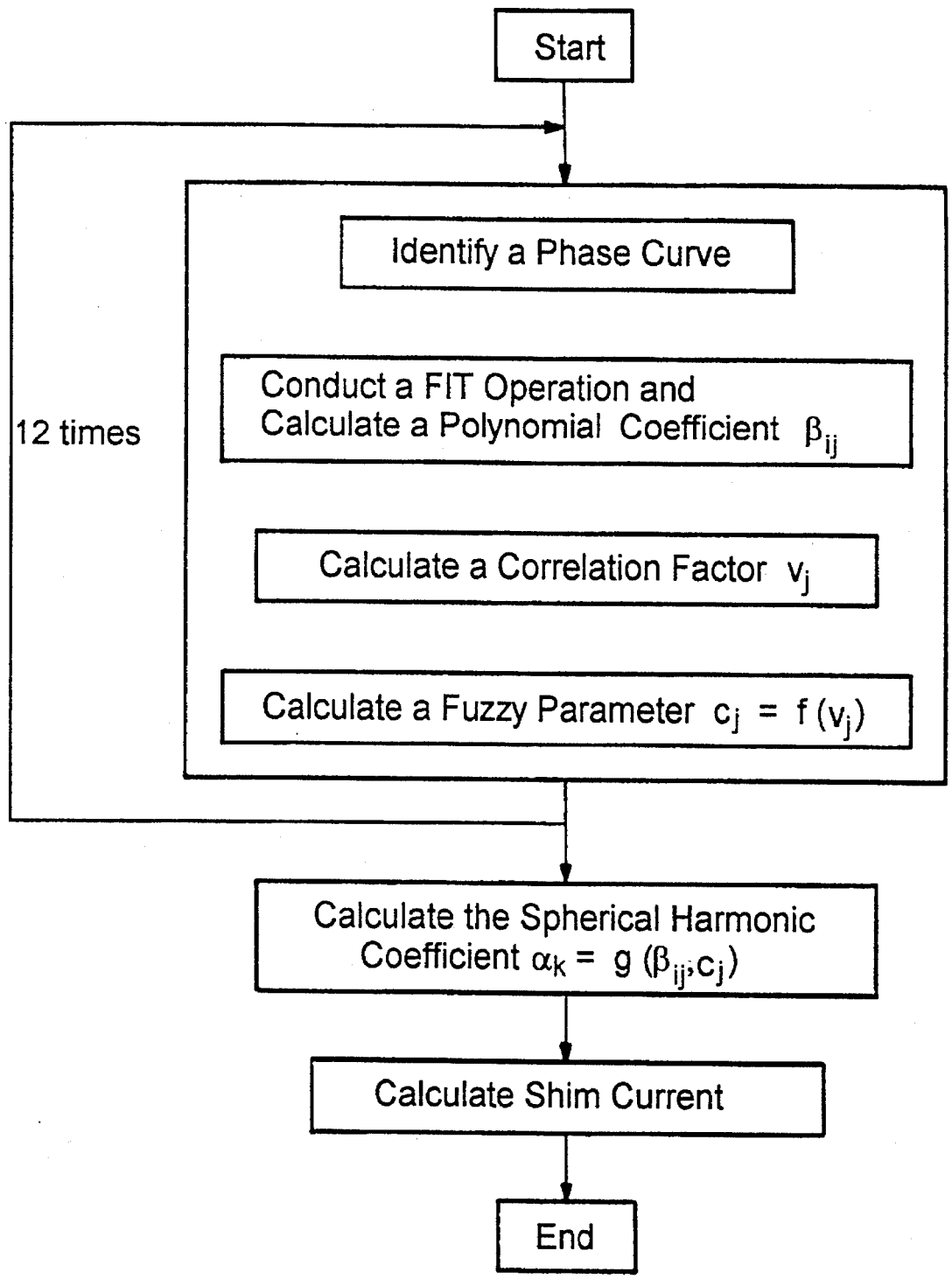
FIG. 16 is a flow chart for the method of the invention.
Figure 17A:
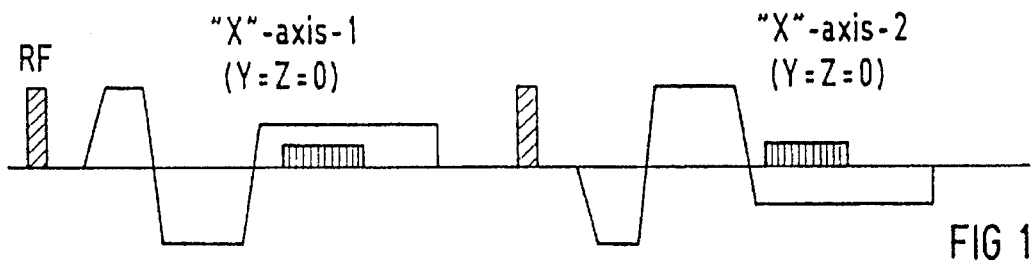
FIGS. 17a through 17f respectively show pulse sequences, in accordance with the inventive method, for calculating the twelve spherical coefficients in the table of FIG. 29.
Figure 17B:
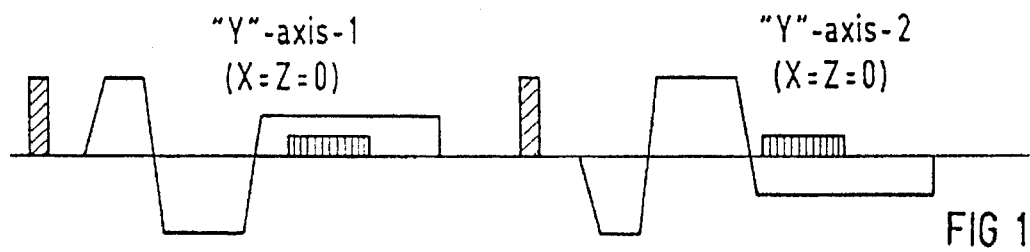
Figure 17C:
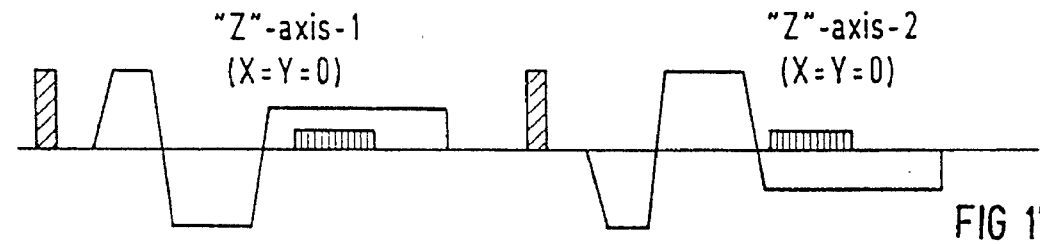
Figure 17D:
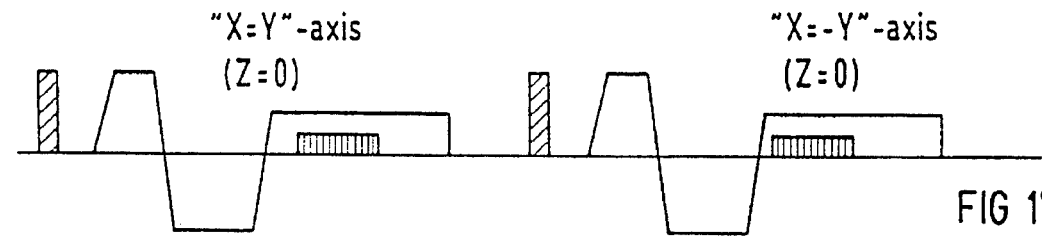
Figure 17E:
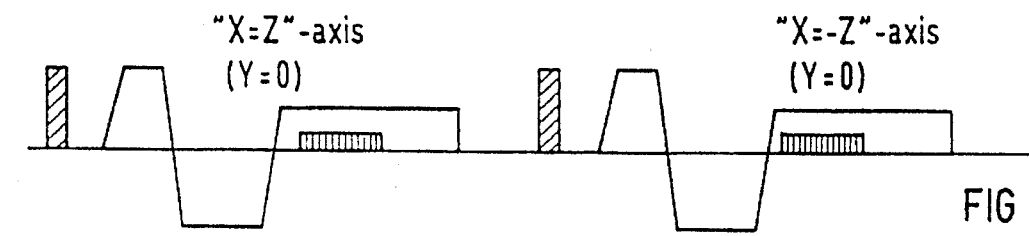
Figure 17F:
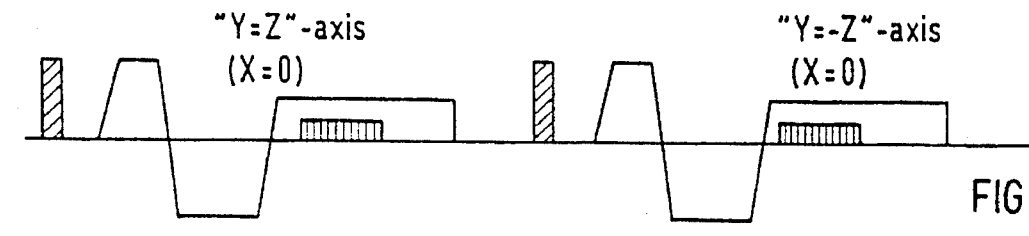

FIG. 16 shows a flow chart for the calculation of the current to be supplied to a single shim coil. The phase curve is first calculated. A FIT operation is then implemented and a polynomial coefficient $\beta_{ij}$ is calculated from the FIT function. The correlation factor $v_j$ is identified and a fuzzy parameter $C_j = f(v_j)$ to be allocated to the polynomial coefficient $\beta_{ij}$ is identified therefrom. This procedure is multiply implemented and the spherical harmonic coefficient $\alpha_k$ is then identified from the plurality of calculated polynomial coefficients $\beta_{ij}$ and from the respectively allocated fuzzy parameters $C_j$. The suitable shim current can then be defined on the basis of this spherical harmonic coefficient.

In practice, offset effects must be eliminated. This can be illustrated with reference to FIGS. 4 and 5. In order to calculate the time shift −Δt1 free of offsets, the same sequence can be undertaken with an inverse operational sign of the gradient $G_{RO}$. The negative time shift −Δt1 (FIG. 4) thus becomes a positive time shift +Δt1 (FIG. 5) and the actual time shift can then be calculated offset-free from the difference between the two times. This correspondingly applies to the Fourier transformation method and to terms of a higher order.

FIGS. 17a through 17f respectively show the pulse sequences that are preferably employed for calculating the twelve spherical coefficients of the table of FIG. 29. The sampling interval for the nuclear magnetic resonance signal is referenced ADC. The x-, y- and z-projections are respectively implemented twice with different operational signs of the gradient. The remaining projections (x=y, x=−y, x=z, x=−z, y=z and y=−z) are each implemented only once. The second measurements for the x-, y- and z-projections respectively yield reference quantities for the elimination of offset effects.

Figure 23:
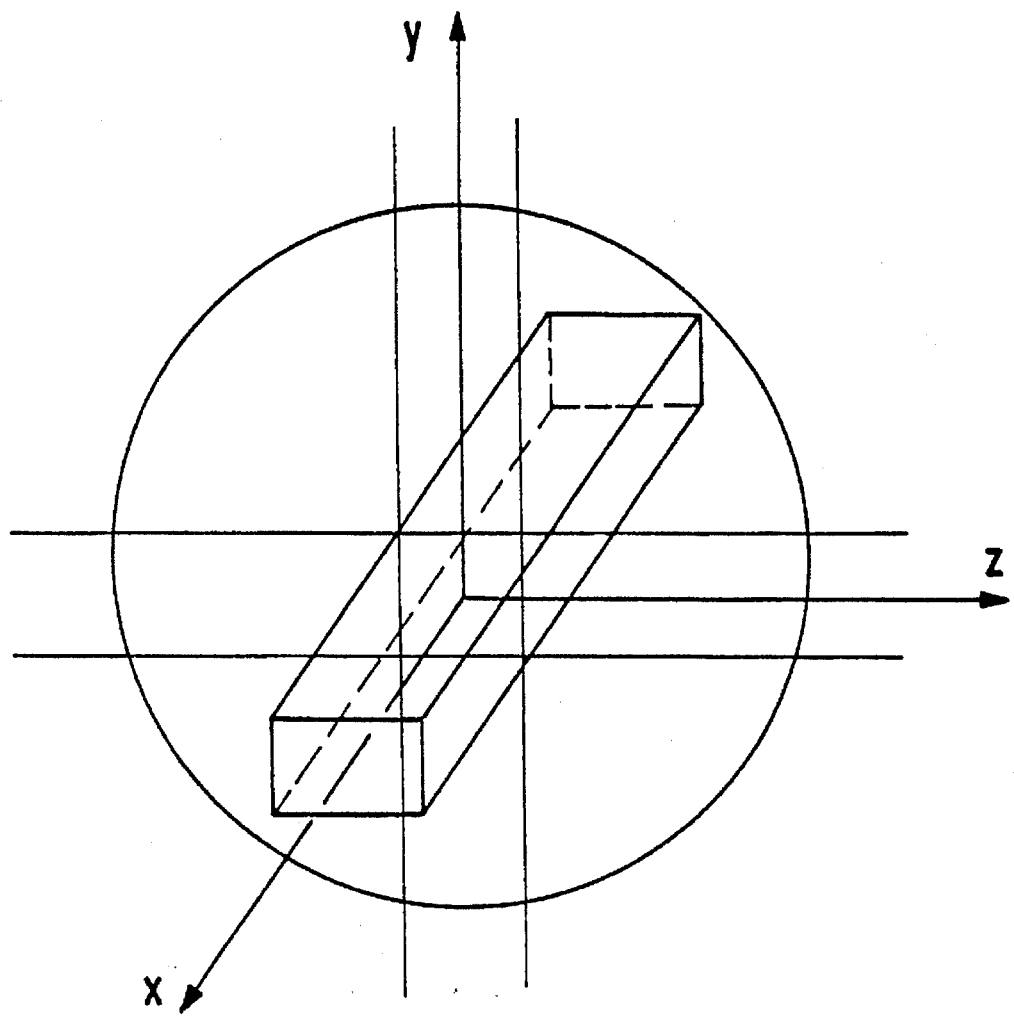
FIG. 23 is a schematic representation of the block of volume which can be examined in accordance with the pulse sequence of FIGS. 18–22.

It can also be advantageous not to refer the shim process to the entire examination volume, but to refer to a block for each projection direction, this block extending in the direction of the projection. This can be achieved by a presaturation with a pulse sequence as shown in FIGS. 18 through 22. A first frequency-selective radio-frequency pulse RF1 is thereby generated together with a gradient $G_y$, so that a slice lying perpendicular to the y-direction is excited. Three spoiler gradients Gx, Gy, Gz then follow, then another radio-frequency pulse RF2 that has a different frequency spectrum from the first radio-frequency pulse RF1 and that is likewise generated in under a gradient $G_y$. Finally, three spoiler gradients Gx, Gy, Gz again follow. All spins that lie outside a central slice lying perpendicular to the y-axis are saturated with the pulse sequence set forth to this point. Further, all spins that lie outside a central slice lying perpendicular to the z-axis are saturated with the further radio-frequency pulses RF3 and RF4, each of which is generated under the influence of a gradient Gz, and with the spoiler gradients Gx, Gy, Gz that follow every radio-frequency pulse RF3, RF4. Only the spins of a block extending in the x-direction thus remain unsaturated, this being shown in FIG. 23. After this presaturation, the spins that are still unsaturated are excited with a further radio-frequency pulse RF5 and a gradient echo signal S is read out as in the preceding examples. As set forth, this pulse sequence must be implemented for a plurality of directions.

Differing from the pulse sequences discussed above, the exemplary embodiment of a pulse sequence according to FIGS. 18 through 22 still contains a motion-refocusing gradient pulse in the x-direction that is referenced GMR (gradient motion refocusing). Motion artifacts can be avoided with this bipolar gradient. The effect of motion-refocusing pulses is disclosed, for example, in U.S. Pat. No. 4,616,180.

Further, another spoiler gradient GS in the x-direction is shown at the end of the sequence, this destroying the phase coherency that still exists, so that a further pulse sequence for another projection can be implemented immediately thereafter.

The selection of an examination volume in block form, which was achieved by presaturation in the example set forth above, can also be achieved by selective excitation. A corresponding exemplary embodiment is set forth below with reference to FIGS. 24 through 28.

FIG. 24 shows a frequency-selective 90° radio-frequency pulse RF1 that is generated under the influence of a slice selection gradient $G_{SL1}$ according to FIG. 25. This results in only a slice residing perpendicular relative to the first slice selection gradient $G_{SL1}$ being excited. Subsequently, the dephasing caused with the positive subpulse is in turn canceled by inverting the first slice selection gradient $G_{SL1}$. The spin population is inverted with a following, frequency-selective 180° radio-frequency pulse RF2. The 180° radio-frequency pulse is generated under a second slice selection gradient $G_{SL2}$, whereby the second slice selection gradient $G_{SL2}$ is perpendicular to the first slice selection gradient $G_{SL1}$. Only those nuclear spins that lie in a slice perpendicular to the direction of the second slice selection gradient $G_{SL2}$ are thus selectively inverted with the 180° radio-frequency pulse RF2.

Finally, a read-out gradient $G_{RO}$ is activated in negative direction and is then inverted. The nuclear magnetic resonance signals are read out under the positive part of the read-out gradient $G_{RO}$, this being identified in FIG. 28 with individual sampling times AD.

All nuclear magnetic resonance signals are thus derived from a region that, first, must lie in the slice excited by the 90° radio-frequency pulse and that, further, lies in the slice inverted by the 180° radio-frequency pulse RF2. Non-inverted nuclear spins do not generate a spin echo and thus do not contribute to the nuclear magnetic resonance signal arising under the read-out gradient $G_{RO}$. A volume that corresponds to the intersection of the two selected slices is thus examined with the illustrated pulse sequence. This volume is in a block corresponding to FIG. 23, whereby the longitudinal direction of the block can be selected by the direction of the slice selection gradients $G_{SL1}$ and $G_{SL2}$. The thickness of the block is then determined by the frequency spectrum of the radio-frequency pulses RF1 and RF2.

As set forth above with reference to FIGS. 6 and 8, information about inhomogeneities in a spin echo sequence is only obtained when the 180° radio-frequency pulse RF2 does not lie centrally between the radio-frequency excitation pulse RF1 and the echo time $T_e$. In the pulse sequence according to FIGS. 24 through 28, the spacing of the actual echo time $T_e$ from an echo time $T_e^*$ which would lie centrally relative to the 180° radio-frequency pulse RF2 is referenced $\Delta T_e$.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:

(a) exciting nuclear spins in said examination space, collecting nuclear magnetic resonance signals and thereby obtaining a data set for calculating coefficients of said spherical, harmonic functions, said nuclear magnetic resonance signals having an amplitude in the time domain and said data set having a plausibility associated therewith which increases with said amplitude;

(b) repeating step (a) a plurality of times to obtain a plurality of data sets from said nuclear magnetic resonance signals;

(c) setting a weighting for each data set representing said plausibility of each data set with a higher weighting representing a higher plausibility;

(d) calculating coefficients of a spherical harmonic function from said data sets including incorporating said weighting into said calculation of said coefficients so that data sets with a higher weighting provide a greater contribution to said coefficients; and (e) generating a current dependent on said coefficients and supplying said current to a shim coil for correcting said inhomogeneities.

2. A method as claimed in claim 1 wherein step (c) comprises setting said weighting according to the rules of fuzzy logic.

3. A method as claimed in claim 1 wherein steps (c), (d), and (e) are conducted for exclusively compensating for linear inhomogeneities in said basic magnetic field.

4. A method as claimed in claim 1 wherein said apparatus is employed for conducting a plurality of examinations, and comprising the additional step of:

conducting steps (a) through (e) prior to each of said examinations.

5. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:

(a) generating a gradient echo sequence in said examination space including a radio-frequency pulse and a bipolar gradient pulse in a given direction to excite nuclear spins in said examination space and thereby obtaining a nuclear magnetic resonance signal;

(b) Fourier-transforming said nuclear magnetic resonance signal to obtain a phase curve of the nuclear spins in said given direction;

(c) repeating steps (a) and (b) with a bipolar gradient pulse in each repetition in a different direction from said given direction to obtain a plurality of phase curves respectively associated with each direction;

(d) analyzing said phase curves with a curve fit method employing a fit curve to obtain a polynomial having coefficients of the $i^{th}$ order;

(e) calculating a correlation factor between said fit curve used in step (d) and each phase curve said correction factor representing a plausibility for that phase curve, with a higher degree of correlation producing a higher correlation factor and, from said correlation factor, calculating a weighting factor for each of said coefficients dependent on the plausibility of the phase curve from which the polynomial having those coefficients was obtained in step (d) with a higher plausibility producing a higher weighting factor;

(f) repeating steps (a) through (e) at least twice and thereby acquiring, for each coefficient of each spherical harmonic function, two polynomial coefficients of the $i^{th}$ order, each of said two polynomial coefficients having a respective weighting factor associated therewith calculated in step (e);

(g) calculating coefficients of said spherical, harmonic functions of the $i^{th}$ order describing the distribution of said basic magnetic field from said at least two polynomial coefficients of the $i^{th}$ order and employing their respective weighting factors, so that polynomial coefficients of the $i^{th}$ order having a higher weighting factor produce a greater contribution to said coefficients of the spherical, harmonic functions of the $i^{th}$ order, said coefficients of the spherical, harmonic functions of the $i^{th}$ order representing inhomogeneities in said basic magnetic field; and (h) generating a current dependent on the coefficients of spherical, harmonic function of the $i^{th}$ order and supplying said current to a shim coil for correcting said inhomogeneities.

6. A method as claimed in claim 5 wherein step (d) comprises analyzing said phase curves with a curve fit method to obtain a polynomial having coefficients of the $i^{th}$ order dependent on a projection prescribed by the direction of said bipolar gradient pulse and using a different projection for each repetition of step (d).

7. A method as claimed in claim 5 wherein step (c) is further defined by repeating steps (a) and (b) in immediate succession with said different directions of said bipolar gradient pulse, and comprising the additional step of generating, in said gradient echo sequence, a spoiler gradient before each radio-frequency pulse.

8. A method as claimed in claim 5 comprising the additional step of:

for each gradient echo sequence, generating a saturation sequence for saturating said nuclear spins outside of a block of selected size in said examination space, said block extending in the direction of the gradient pulse in each sequence.

9. A method as claimed in claim 5 wherein step (a) is further defined by:
   (a) generating a gradient echo sequence in said examination space including a slice-selective radio-frequency pulse in the presence of slice selection gradient, and a bipolar gradient pulse in a given direction to excite nuclear spins in said examination space and thereby obtaining a nuclear magnetic resonance signal.

10. A method as claimed in claim 5 wherein steps (d), (e), (f) (g) and (h) are conducted for exclusively compensating for linear inhomogeneities in said basic magnetic field.

11. A method as claimed in claim 5 wherein said apparatus is employed for conducting a plurality of examinations, and comprising the additional step of:
   conducting steps (a) through (h) prior to each of said examinations.

12. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:
   (a) generating a spin echo sequence in said examination space including, in chronological sequence, a first radio-frequency pulse, a first gradient pulse in a given direction, a second radio-frequency pulse and a second gradient pulse in said given direction to excite nuclear spins in said examination volume for thereby generating a nuclear magnetic resonance signal which is read out under said second gradient pulse, said radio-frequency pulse being non-central relative to said first radio-frequency pulse and said nuclear magnetic resonance signal;
   (b) Fourier-transforming said nuclear magnetic resonance signal to obtain a phase curve of the nuclear spins in said given direction;
   (c) repeating steps (a) and (b) with a gradient pulses in each repetition in a different direction to obtain a plurality of phase curves respectively associated with said different directions;
   (d) analyzing said phase curves with a curve fit method employing a fit curve to obtain a polynomial having coefficients of the $i^{th}$ order;
   (e) calculating a correlation factor between said fit curve used in step (d) and each phase curve said correction factor representing a plausibility for that phase curve, with a higher degree of correlation producing a higher correlation factor and, from said correlation factor, calculating a weighting factor for each of said coefficients dependent on the plausibility of the phase curve from which the polynomial having those coefficients was obtained in step (d) with a higher plausibility producing a higher weighting factor;
   (f) repeating steps (a) through (e) at least twice and thereby acquiring, for each coefficient of each spherical harmonic function, two polynomial coefficients of the $i^{th}$ order, each of said two polynomial coefficients having a respective weighting factor associated therewith calculated in step (e);
   (g) calculating coefficients of said spherical, harmonic functions of the $i^{th}$ order describing the distribution of said basic magnetic field from said at least two polynomial coefficients of the $i^{th}$ order and employing their respective weighting factors, so that polynomial coefficients of the $i^{th}$ order having a higher weighting factor produce a greater contribution to said coefficients of the spherical, harmonic functions of the $i^{th}$ order, said coefficients of the spherical, harmonic functions of the $i^{th}$ order representing inhomogeneities in said basic magnetic field; and
   (h) generating a current dependent on the coefficients of spherical, harmonic function of the $i^{th}$ order and supplying said current to a shim coil for correcting said inhomogeneities.

13. A method as claimed in claim 12 wherein step (c) is further defined by repeating steps (a) and (b) in immediate succession with said different directions of said gradient pulse, and comprising the additional step of generating, in said spin echo sequence, a spoiler gradient before each radio-frequency pulse.

14. A method as claimed in claim 12 comprising the additional step of:
   for each gradient pulse sequence, generating a saturation sequence for saturating said nuclear spins outside of a block of selected size in said examination space, said block extending in the direction of the gradient pulse in each sequence.

15. A method as claimed in claim 12 wherein step (a) is further defined by:
   (a) generating a spin echo sequence in said examination space including a slice-selective radio-frequency pulse in the presence of slice selection gradient.

16. A method as claimed in claim 12 wherein said apparatus is employed for conducting a plurality of examinations, and comprising the additional step of:
   conducting steps (a) through (f) prior to each of said examinations.

17. A method as claimed in claim 12 wherein steps (d), (e) and (f) are conducted for exclusively compensating for linear inhomogeneities in said basic magnetic field.

18. A method for shimming a basic magnetic field in an examination space of a nuclear magnetic resonance apparatus, said basic magnetic field being mathematically representable in the form of spherical, harmonic functions whereby shim coils are arranged in the nuclear magnetic resonance apparatus which are fashioned such that each shim coil essentially influences one coefficient of these functions, said method comprising the steps of:
   (a) exciting nuclear spins in said examination space, collecting nuclear magnetic resonance signals and thereby obtaining a data set for calculating coefficients of said spherical, harmonic functions, said data set having a plausibility associated therewith;
   (b) repeating step (a) a plurality of times to obtain a plurality of data sets from said nuclear magnetic resonance signals;
   (c) assigning a plausibility to each data set dependent for a degree of correlation of said data set with a predetermined reference with a higher degree of correlation producing a higher plausibility;
   (d) setting a weighting for each data set representing said plausibility of each data set with a higher plausibility producing a higher weighting;
   (e) calculating coefficients of a spherical harmonic function from said data sets including incorporating said weighting into said calculation of said coefficients so that data sets with a higher weighting provide a greater contribution to said coefficients; and (f) generating a current dependent on said coefficients and supplying said current to a shim coil for correcting said inhomogeneities.

19. A method as claimed in claim 18 wherein step (d) comprises setting said weighting according to the rules of fuzzy logic.

20. A method as claimed in claim 18 wherein steps (d), (e) and (f) are conducted for exclusively compensating for linear inhomogeneities in said basic magnetic field.

21. A method as claimed in claim 18 wherein said apparatus is employed for conducting a plurality of examinations, and comprising the additional step of:

conducting steps (a) through (f) prior to each of said examinations.

* * * * *